United States Patent
Mizuno et al.

[11] Patent Number: 6,077,757
[45] Date of Patent: Jun. 20, 2000

[54] METHOD OF FORMING CHIP SEMICONDUCTOR DEVICES

[75] Inventors: Hideki Mizuno; Kazunao Tokunaga, both of Tokyo, Japan

[73] Assignee: NEC Corporation, Tokyo, Japan

[21] Appl. No.: 09/020,789

[22] Filed: Feb. 9, 1998

[30] Foreign Application Priority Data

May 15, 1997 [JP] Japan ..................................... 9-125408

[51] Int. Cl.[7] .................................................. H01L 21/46
[52] U.S. Cl. .......................... 438/465; 438/110; 438/114; 438/458; 438/464
[58] Field of Search ..................................... 438/106, 108, 438/110, 113, 114, 465, 126, 464, 458; 148/DIG. 28

[56] References Cited

U.S. PATENT DOCUMENTS

| | | | |
|---|---|---|---|
| 4,468,857 | 9/1984 | Christian et al. | 438/458 |
| 4,864,514 | 9/1989 | Yamanaka et al. | 395/500.2 |
| 4,904,610 | 2/1990 | Shyr | 438/464 |
| 5,020,715 | 6/1991 | Kimura et al. | 228/102 |
| 5,266,528 | 11/1993 | Yamada | 438/464 |
| 5,323,051 | 6/1994 | Adams et al. | 257/417 |
| 5,373,627 | 12/1994 | Grebe | 438/126 |
| 5,547,906 | 8/1996 | Badehi et al. | 438/114 |
| 5,561,085 | 10/1996 | Gorowitz et al. | 438/126 |
| 5,604,160 | 2/1997 | Warfield | 438/113 |
| 5,757,068 | 5/1998 | Kata et al. | 257/668 |
| 5,851,845 | 12/1998 | Wood et al. | 438/114 |
| 5,863,813 | 1/1999 | Dando | 438/114 |
| 5,866,950 | 2/1999 | Iwasaki et al. | 257/782 |
| 5,949,140 | 9/1999 | Nishi et al. | 257/728 |

*Primary Examiner*—Carl Whitehead, Jr.
*Assistant Examiner*—Jeff Vockrodt
*Attorney, Agent, or Firm*—Young & Thompson

[57] ABSTRACT

A method of fabricating a chip semiconductor device includes steps in which electrically conductive bumps are provided on electrodes of semiconductor elements on a wafer, an insulating substrate having an electrode pattern is combined onto the wafer so that the electrode pattern is made into contact with the bumps, only the wafer on which the semiconductor elements are provided is divided by grooves into a plurality of chips each of which has a semiconductor element, a liquid resin is flowed into the grooves and onto the chips for subsequent curing the resin, and the cured resin and the insulating substrate are concurrently cut along the grooves so that a plurality of semiconductor devices are formed.

12 Claims, 13 Drawing Sheets

METHOD OF FORMING CHIP SEMICONDUCTOR DEVICES

BACKGROUND OF THE INVENTION

The present invention relates to a chip semiconductor device and a method of forming the same.

FIGS. 1 and 2 are fragmentary cross sectional elevation views illustrative of sequential steps involved in a method of forming a semiconductor chip including a semiconductor device. This conventional method is disclosed in Japanese laid-open patent publication No. 4-148553. As illustrated in FIG. 1, a mother board 24 has top and bottom surfaces each of which is provided with a plurality of electrodes thereon. The mother board 24 has a plurality of through holes 25, each of which is filled with a contact 26 so that each pair of the electrodes provided on the top and bottom surfaces are electrically connected through the contact 26 in the through hole 25. Elements 27 are provided on the top surface of the mother board 24 between the through holes 25. Each of the elements 27 is electrically connected through wirings 28 to the electrodes provided on the top surface of the mother board 24.

As illustrated in FIG. 2, a sealing cap 31 having a plurality of recessed portions 32 is placed on and fixed to the mother board 24 so that the recessed portions 32 accommodate the elements 27 and the wirings 28. The mother board 24 with the sealing cap 31 are cut along C—C lines to be divided into a plurality of semiconductor chips 41. FIG. 3 is a schematic view illustrative of the individual chip.

The size of the individual recessed portion 32 has to be larger than the semiconductor element 27 by about 200 micrometers to form a space for the wirings 28 and in consideration of an accuracy of alignment of the cap. For this reason, it is difficult to reduce the size of the recessed portion near the semiconductor element size.

The rate of mounting of the elements 27 onto the mother board 24 is as fast as 0.6 seconds per unit. It is difficult to obtain a remarkable increase in the rate of the mounting of the elements 27. The productivity of the semiconductor chips 41 is limited by the rate of the mounting of the elements 27. For this reason, it is difficult to obtain a remarkable increase in the productivity of the semiconductor elements.

In the above circumstances, it had been required to develop a novel method of fabricating a chip semiconductor device free from the above problems.

SUMMARY OF THE INVENTION

Accordingly, it is an object of the present invention to provide a novel method of fabricating a chip semiconductor device free from the above problems.

It is a further object of the present invention to provide a novel method of fabricating a chip semiconductor device having a reduced size.

It is a still further object of the present invention to provide a novel method of fabricating a chip semiconductor device at an improved productivity per unit time.

It is yet a further object of the present invention to provide a novel method of fabricating a chip semiconductor device at an improved yield thereof.

The above and other objects, features and advantages of the present invention will be apparent from the following descriptions.

In accordance with the present invention, a method of fabricating a chip semiconductor device comprises the following steps. In a first step, electrically conductive bumps are provided on electrodes of semiconductor elements on a wafer. In a second step, an insulating substrate having an electrode pattern is combined onto the wafer so that the electrode pattern is made into contact with the bumps. In a third step, only the wafer on which the semiconductor elements are provided is divided by grooves into a plurality of chips each of which has a semiconductor element. In a fourth step, a liquid resin is flowed into the grooves and onto the chips for subsequent curing the resin. In a fifth step, the cured resin and the insulating substrate are concurrently cut along the grooves so that a plurality of semiconductor devices are formed.

There is no process for mounting the individual semiconductor elements separately because the electrode patterns of the insulating substrate is bonded to the bumps on the semiconductor elements on the wafer.

There is raised no problem with deterioration in the accuracy of the alignment of the semiconductor devices.

It is further possible to form a sealing resin film with a uniform and reduced thickness.

Further more, the shape and the size of the insulating substrate are the same as the semiconductor wafer because the electrode pattern of the insulating substrate is bonded to the bumps of the semiconductor elements.

It is easily possible to position the bumps and the semiconductor elements because the size and shape of the insulating substrate are the same as the semiconductor wafer as well as because the electrode patterns are so formed by use of positional coordinates of the electrodes over the semiconductor wafer.

In accordance with the further present invention, a method of fabricating a chip semiconductor device comprises the following steps. In a first step, a first resin is applied on a first surface of a semiconductor wafer having a second surface on which a plurality of semiconductor elements have already been provided, which have a predetermined electrode pattern, before the applied resin is cured. In a second step, an insulating substrate is combined onto the first surface of the semiconductor wafer. In a third step, via holes and dicing recognition patterns are formed in the insulating substrate so that the electrode pattern is partially shown through the via holes. In a fourth step, electrically conductive bumps are formed, which are connected through the via holes to the electrode pattern. In a fifth step, the dicing recognition pattern is used to form grooves in the combined semiconductor wafer and the insulating substrate so as to divide the combined semiconductor wafer and the insulating substrate into a plurality of parts by the grooves. In a sixth step, a second resin is filled into the grooves and then cured. In a seventh step, the combined semiconductor wafer and the insulating substrate are cut off along the grooves filled with the second resin so that the combined semiconductor wafer and the insulating substrate are divided into a plurality of semiconductor devices.

As described above, the dicing recognition pattern is formed on the insulating substrate so that the combined semiconductor wafer and insulating substrate are divided by the groves which have been formed by use of the dicing recognition pattern, wherein the insulation substrate has no electrode pattern. In the above step, the divided semiconductor devices have cross sections which are covered by and protected by the second resin.

Further, the first and second resins prior to the curing process may be the same resin material in a liquid state.

It is further provide an additional process for connecting lead electrodes onto the electrically conductive bumps.

It is furthermore possible that the electrically conductive bumps may be made of a metal.

BRIEF DESCRIPTION OF THE DRAWINGS

Preferred embodiments according to the present invention will be described in detail with reference to the accompanying drawings.

PREFERRED EMBODIMENTS

First Embodiment

Figure 1:
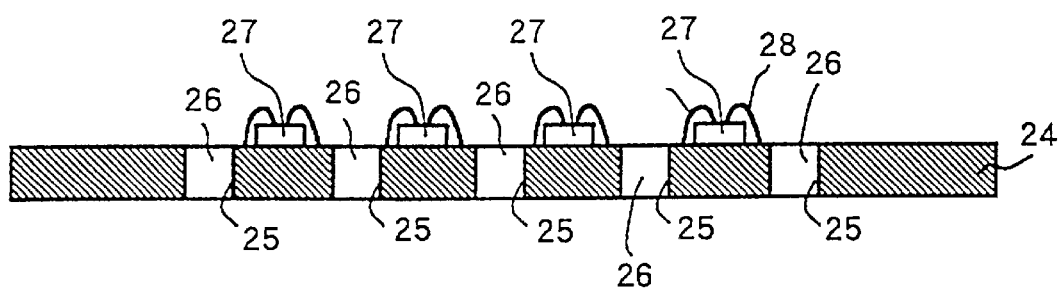
FIG. 1 is a cross sectional elevation view illustrative of a mother board to be used in a first step involved in the conventional fabrication processes for the chip semiconductor devices.
Figure 2:
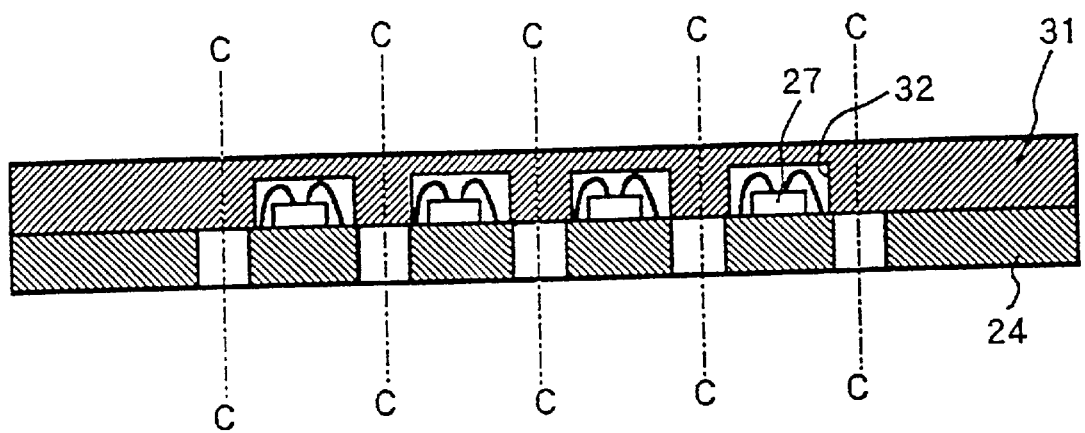
FIG. 2 is a cross sectional elevation view illustrative of a mother board and a sealing cap covering the mother board in a second step involved in the conventional fabrication processes for the chip semiconductor devices.
Figure 3:
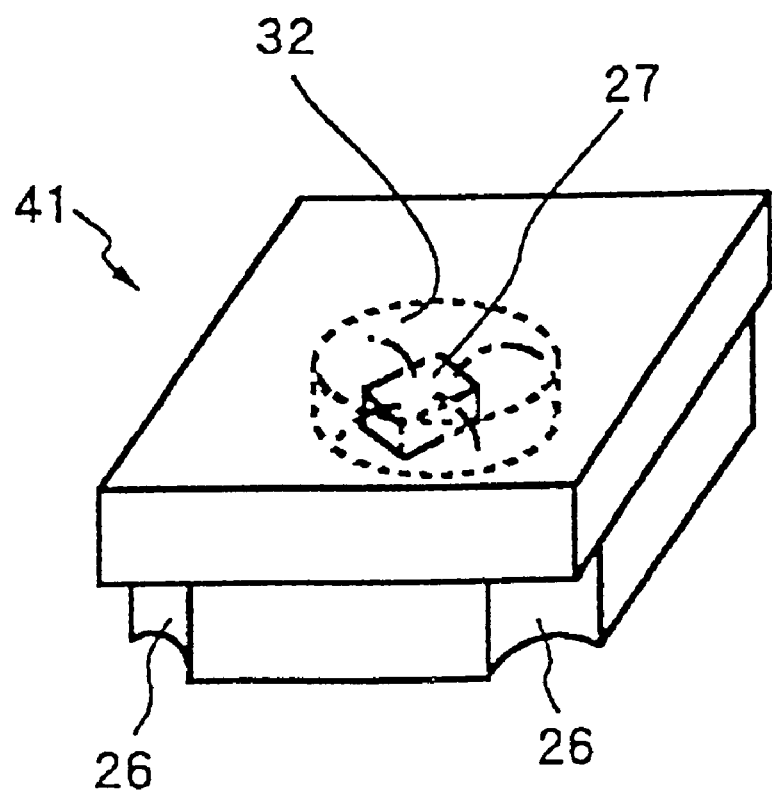
FIG. 3 is a schematic view illustrative of a chip semiconductor device fabricated by the conventional processes of FIGS. 1 and 2.
Figure 4A:
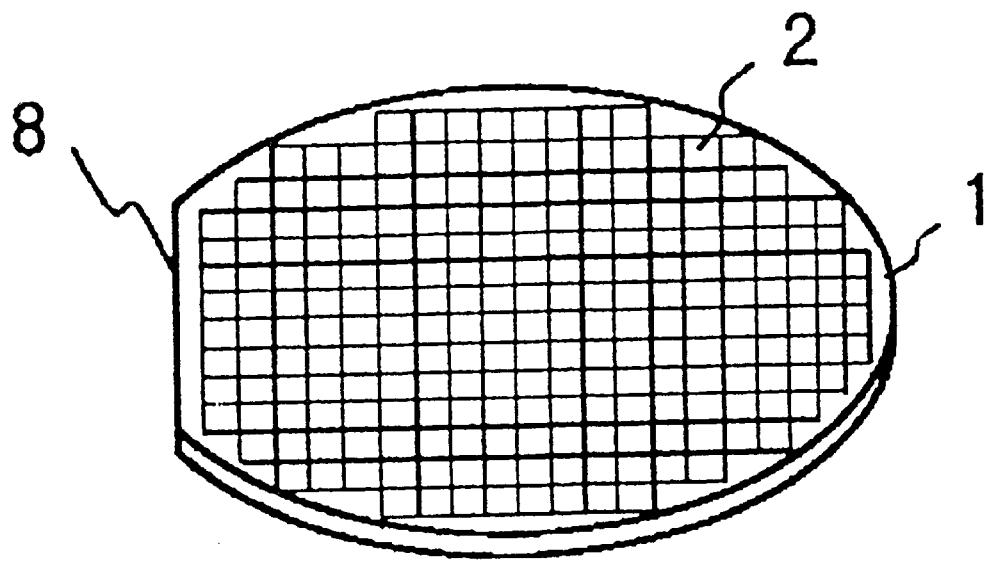
FIGS. 4A through 4F are schematic views illustrative of sequential steps involved in a novel method of forming a plurality of semiconductor devices from a semiconductor wafer in accordance with the present invention.
Figure 5A:
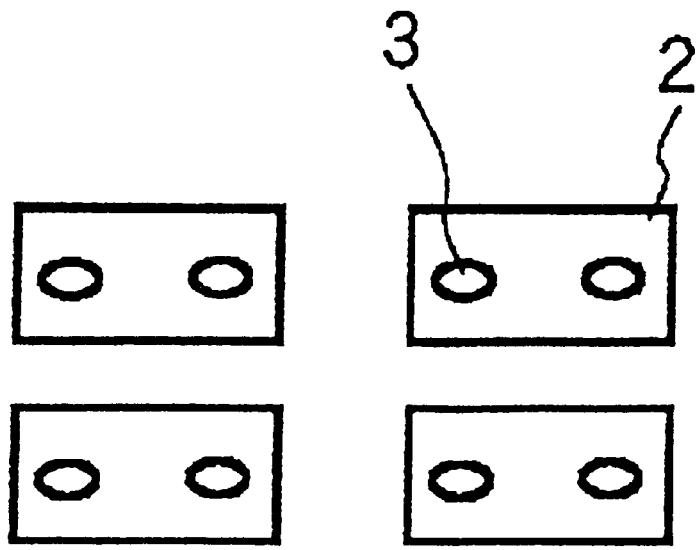
FIGS. 5A through 5C are supplemental views illustrative of sequential steps involved in a novel method of forming a plurality of semiconductor devices from a semiconductor wafer in accordance with the present invention.

A first embodiment according to the present invention will be described in detail as follows. As illustrated in FIG. 4A, a semiconductor wafer 1 is prepared which has a plurality of semiconductor devices 2. The semiconductor wafer 1 has an orientation flat 8. Each of the semiconductor devices 2 has electrodes 3 as illustrated in FIG. 5A.

Figure 4B:
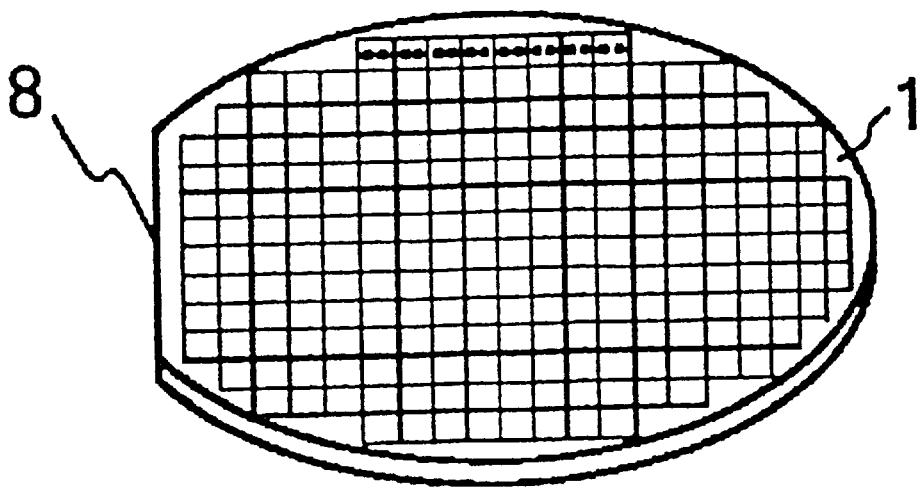
Figure 5B:
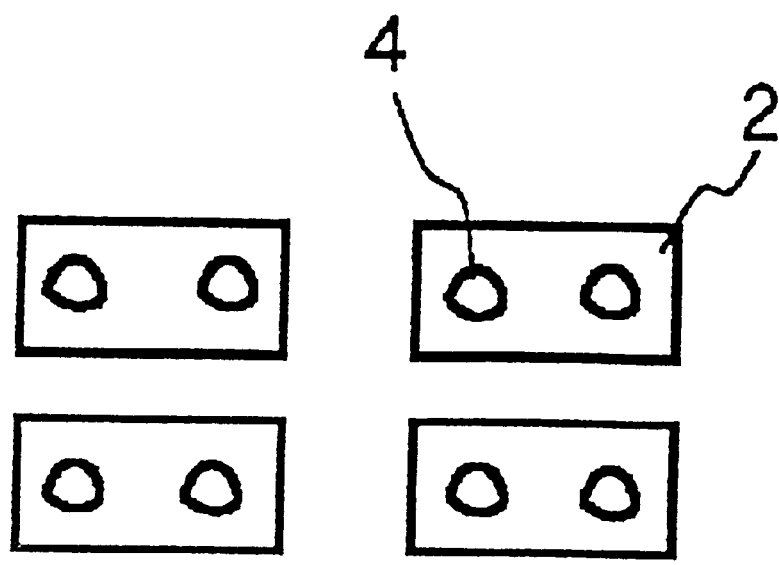

As illustrated in FIGS. 4B and 5B, metal bumps are formed on the semiconductor devices 2. Whereas the metal bumps 4 may be formed by ball bump method or solder bump printing method, any other method of forming the metal bumps may be used.

Figure 4C:
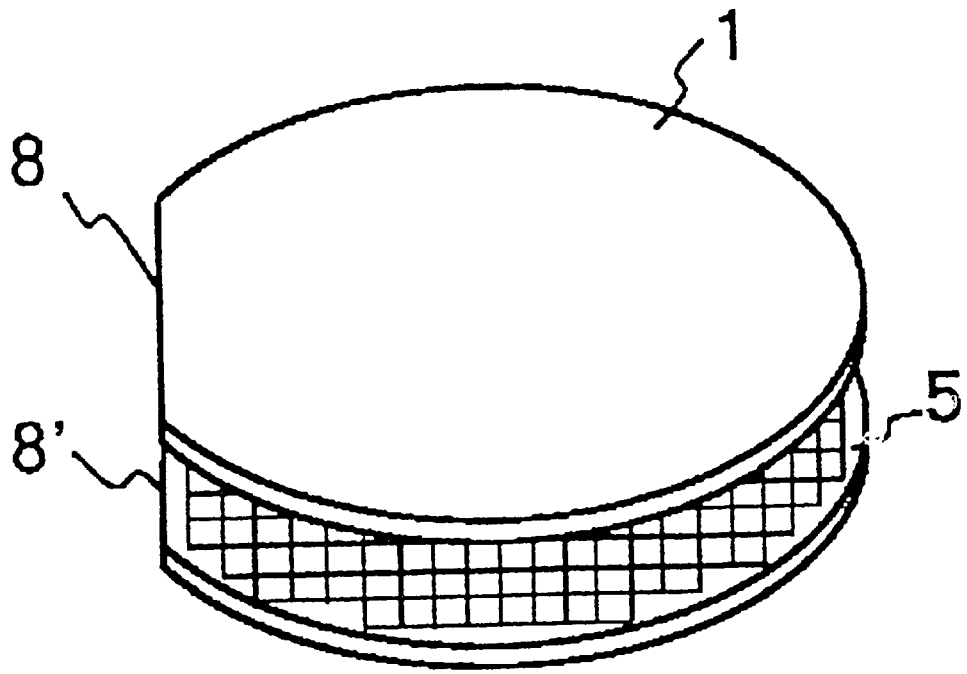
Figure 5C:
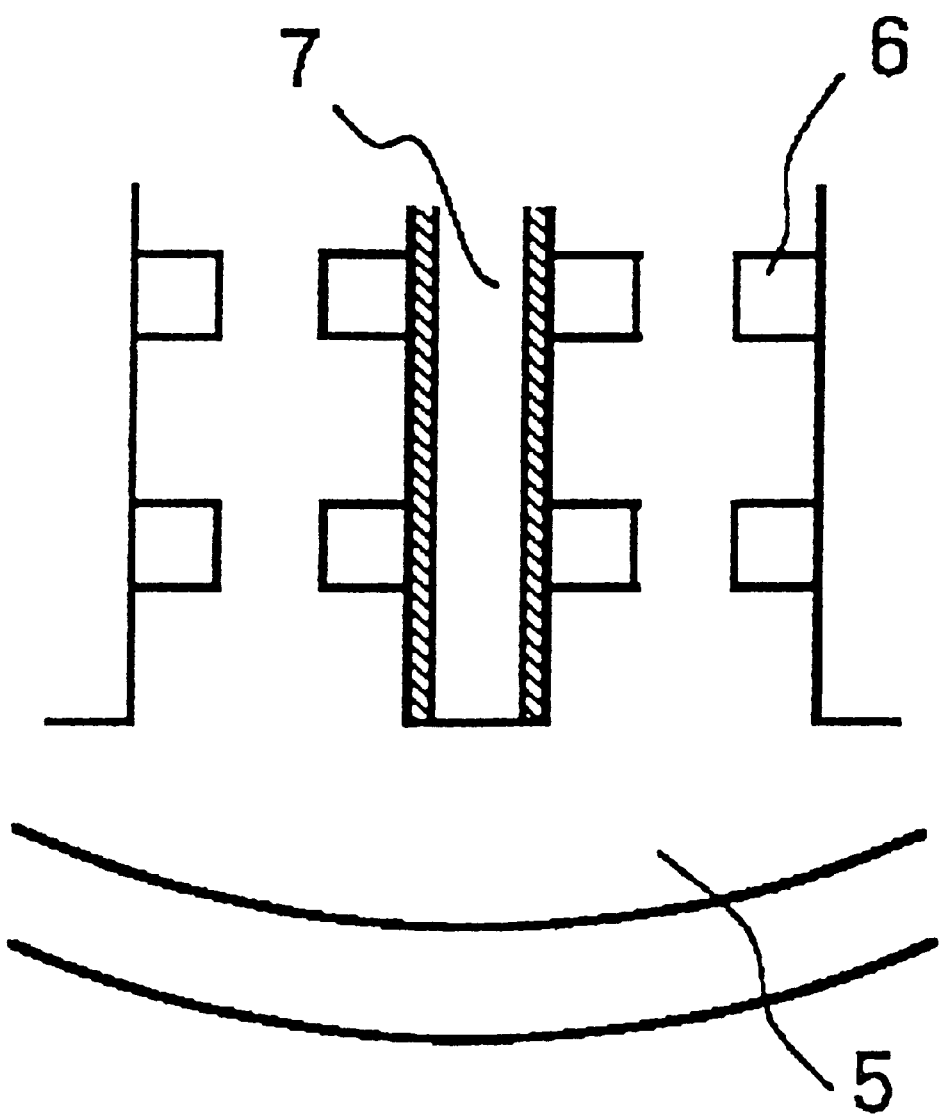

As illustrated in FIG. 4C, an insulation substrate 5 with an orientation flat 8' is prepared, which has electrode patterns before the insulation substrate 5 is then combined onto the semiconductor wafer 1 so that the electrode patterns contact the metal bumps 4. FIG. 5C is illustrative of electrode patterns 6 formed on the insulation substrate 5. Grooves 7 have been formed in the insulating substrate 5 before metallization for forming the electrode patterns 6 extending through the grooves 7 to the opposite surface. Alternatively, the electrode patterns 6 may be formed which extend through the through holes.

In order to realize a highly accurate alignment between the metal bumps 4 on the semiconductor devices 2 and the electrode patterns 6 on the insulating substrate 5, the electrode patterns 6 are formed by positioning of the electrode patterns 6 over the insulating substrate 5 on the basis of positional coordinate data of the electrodes 3 of the semiconductor devices 2 over the semiconductor wafer 1.

The insulating substrate 5 has the same size and shape as the semiconductor wafer 1. The insulating substrate 5 also has the same size orientation flat 8' as the orientation flat 8 of the semiconductor wafer 1. For this reason, it is possible that the electrode patterns 6 are formed by printing method at the corresponding positions to the electrodes 3 of the semiconductor wafer 1. Namely, the alignment between the bumps and the electrode patterns may be made by an alignment of the orientation flats 8 and 8'. The insulating substrate 5 and the semiconductor wafer 1 are bonded by an insulating adhesive material.

Figure 4D:
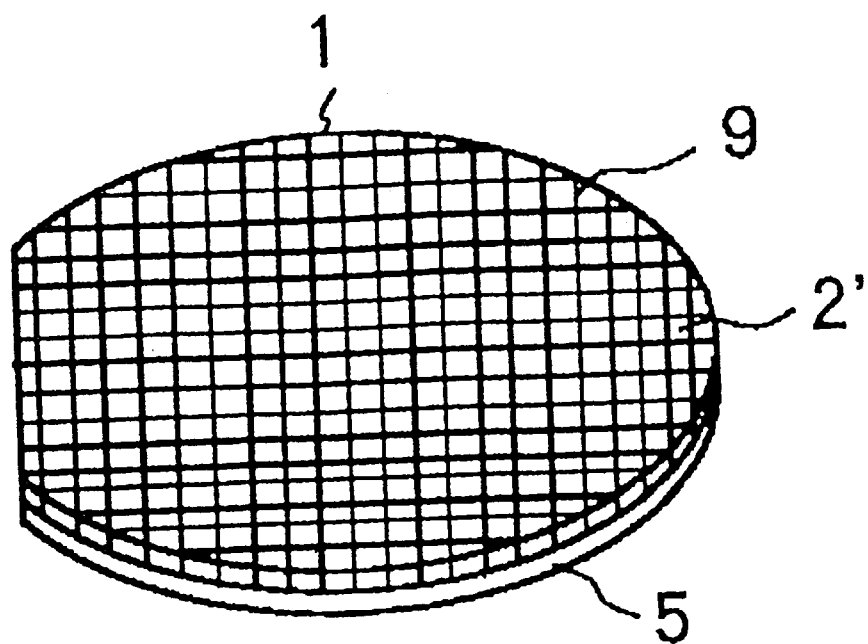

As illustrated in FIG. 4D, dicing grooves 9 are formed only in the semiconductor wafer 1 so that only the semiconductor wafer 1 is cut to divide the same into the same size as the semiconductor devices 2' by use of the positional coordinate data of the semiconductor devices 2. A dicing saw may be used to cut the semiconductor wafer 1. The diving groves 9 may have a width of about 60 micrometers.

Figure 4E:
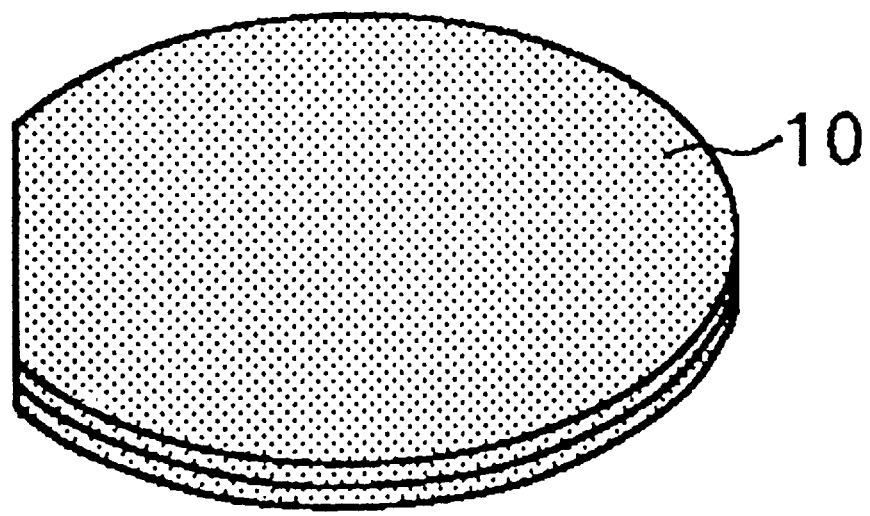

As illustrated in FIG. 4E, a sealing resin 10 in liquid state is flowed into the dicing grooves 9 and onto the semiconductor devices 2' before the curing the sealing resin 10 by a thermosetting process or a photo-curing process.

Figure 4F:
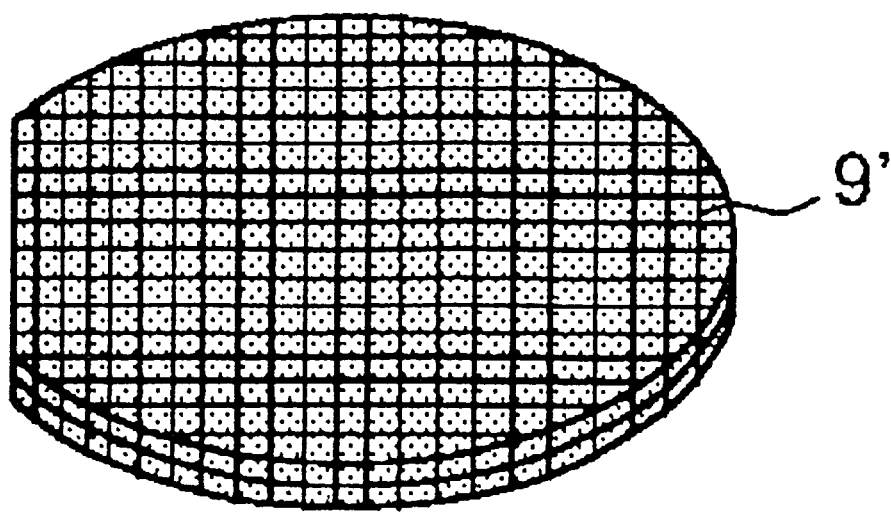
Figure 6:
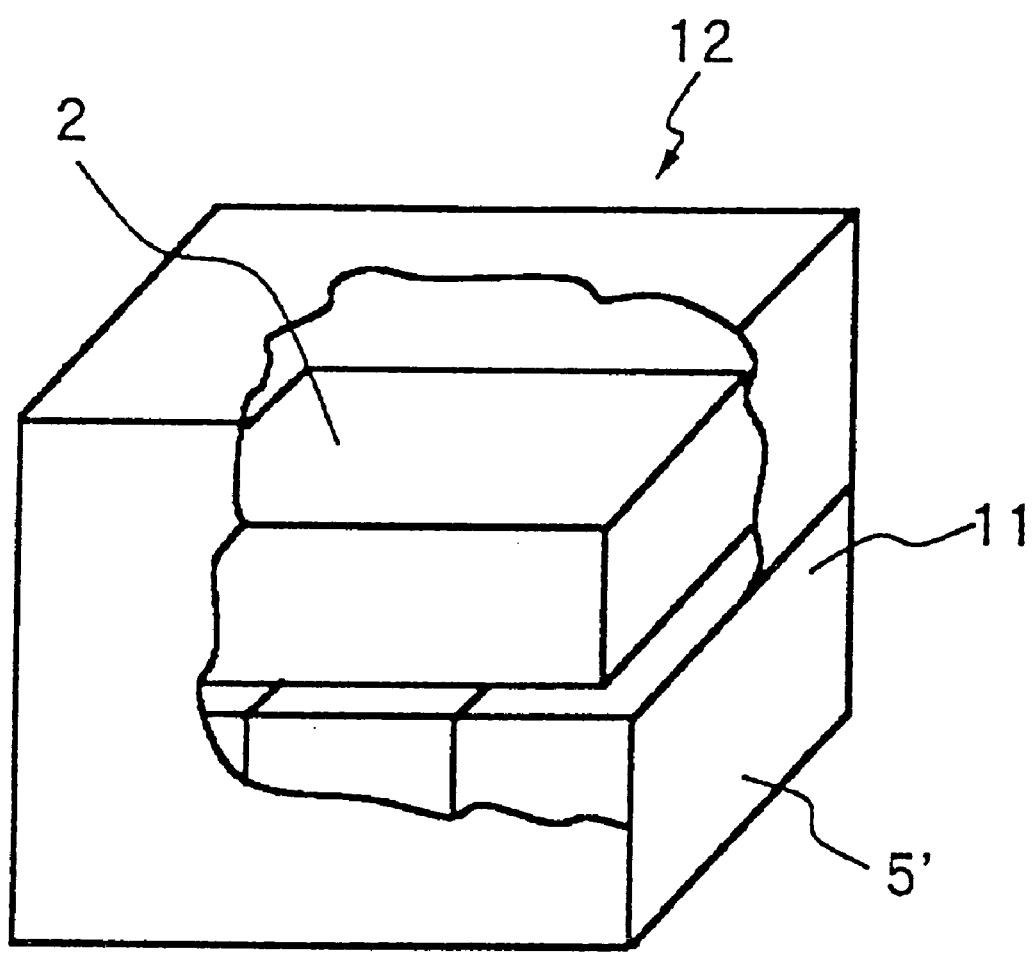
FIG. 6 is a schematic view illustrative of a chip semiconductor device fabricated by the novel processes of FIGS. 4A through 4F and 5A through 5C.

As illustrated in FIG. 4F, the combined semiconductor wafer 1 and the insulating substrate 5 are cut by further dicing process along the dicing grooves 9' to form dicing grooves 9' which divide the same into a plurality of chip semiconductor devices. The width of the dicing grooves 9' may be about 20 micrometers. As a result, chip semiconductor devices 12 are formed as illustrated in FIG. 6. The semiconductor device 2 is coated by the resin and is placed on the divided insulating substrate 5'. Cut sections 11 of the chip semiconductor devices are defined by the dicing grooves 9'.

As described above, the semiconductor wafer 1 having been formed thereon with a plurality of the semiconductor devices 2 is combined onto the insulating substrate 5 having been formed with the electrode patterns 6 so as to realize a highly accurate alignment between the bumps and the electrode patterns. Further the uniformly thin resin layer 10 has been formed to seal the semiconductor devices 2 before the cutting or dicing the semiconductor wafer combined with the insulating substrate, for which reason it is possible that the size of the chip semiconductor devices 12 may be reduced to that of the semiconductor devices 2.

Since many semiconductor devices 2 are mounted on the semiconductor wafer 1, the productivity per a unit is remarkably increased. If, for example, about 70,000 elements are provided on the semiconductor wafer of 125 millimeters in diameter and it takes 5 minutes to bond the semiconductor wafer onto the insulating substrate, then it takes 0.004 seconds per a unit to mount the semiconductor device onto the semiconductor wafer 1. This means that the productivity is improved by 150 times as compared to when the semiconductor devices are separately mounted onto the semiconductor wafer.

By the way, for the above novel method, it is difficult to obtain a remarkable effect of mass production because the insulating substrate 5 has to have the same size and shape as the semiconductor wafer 1 and also the electrode patterns are printed so that the electrode patterns are superimposed on the metal bumps 4 of the semiconductor devices 2.

Further, in the above novel method, the positional coordinate data of the electrodes 3 of the semiconductor devices 2 over the semiconductor wafer 1 are read out by passing a light through the insulating substrate 5, for which reason a difference in reflective index may cause variations in the positional data on coordinate.

Furthermore, even though only the semiconductor wafer 1 has to be diced, the semiconductor wafer 1 is bonded with the insulating substrate 5 and a distance between the semiconductor wafer 1 and the insulating substrate 5 is small, for which reason the semiconductor wafer 1 is broken in the dicing process.

Second Embodiment

A second embodiment according to the present invention will be described in detail with reference to FIGS. 7A through 7F wherein a novel method of fabricating chip semiconductor devices will be described which is free from the above disadvantages as described in the first embodiment.

Figure 7A:
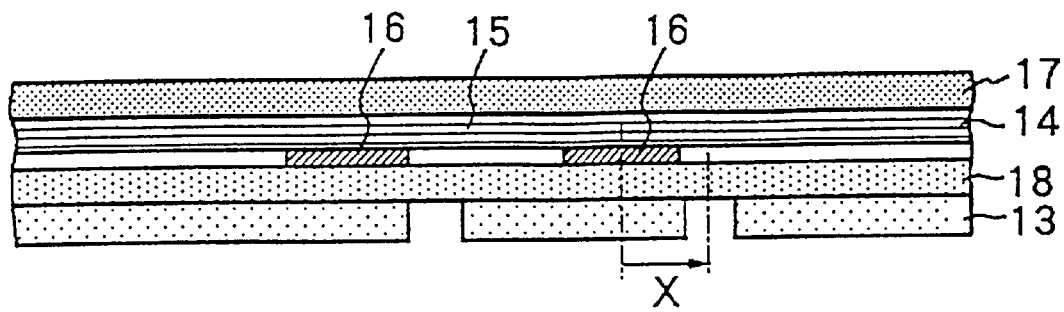
FIGS. 7A through 7F are fragmentary cross sectional elevation views illustrative of another novel method of forming a plurality of semiconductor devices from a semiconductor wafer in accordance with the present invention.

As illustrated in FIG. 7A, a semiconductor wafer 14 has on its first surface a plurality of semiconductor devices 15. A resin in a liquid state is applied onto a second surface of the semiconductor wafer 14 for subsequent curing of the resin to form a uniformly thin resin layer 17 on the second surface of the semiconductor wafer 14. Electrode patterns 16 are formed on the semiconductor devices 2 over the semiconductor wafer 14. An insulating substrate 18 free of electrode pattern is bonded onto the electrode patterns 16 on the semiconductor devices 2 over the semiconductor wafer 14. A photo-resist pattern 13 is provided on the insulating substrate 18. The semiconductor wafer 14 may comprise a GaAs wafer of 100 micrometers in thickness. The insulating substrate 18 may comprise a highly resistive GaAs substrate of 100 micrometer sin thickness. Polyimide and photo-resist may be available for bonding the insulating substrate to the semiconductor wafer.

Figure 7B:
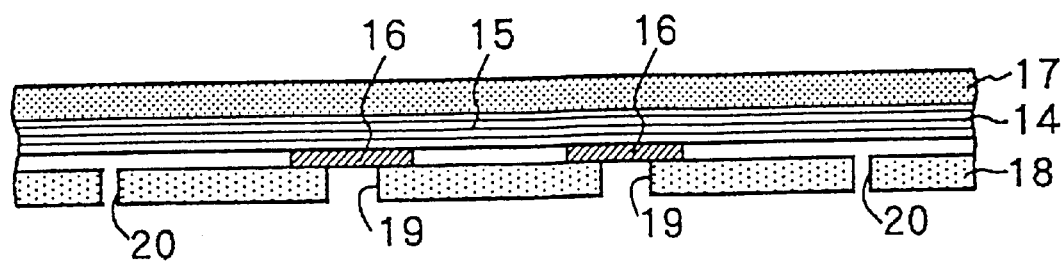

As illustrated in FIG. 7B, the photo-resist pattern 13 is used as a mask for subsequent etching of the insulating substrate 18 to form via holes 19 and dicing recognition patterns 20 in the insulating substrate 18 before the used photo-resist mask is removed. By forming the via holes 19, the electrode patterns 16 are partially shown. The electrode patterns comprise 80 micrometers squares. The via hole may be shaped in 40 micrometers square. The via holes may be formed by dry etching process using the photo-resist technique. The alignment of the via hole patterns and the electrode patterns is made by use of the infrared ray. If any displacement between them can be detected, then the above process is made again until the accurate alignment can be obtained.

Figure 7C:
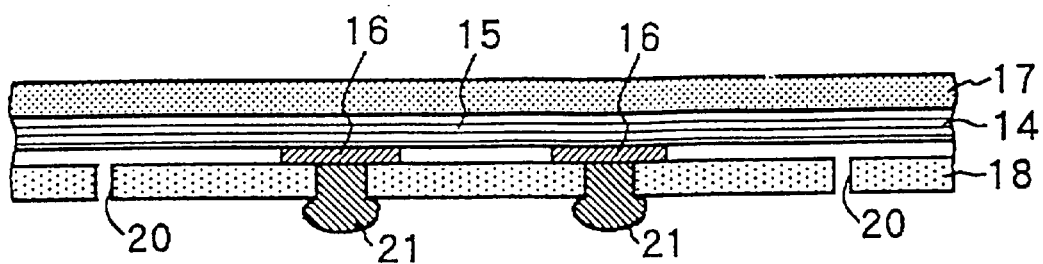

As illustrated in FIG. 7C, metal bumps 21 are formed on the electrode patterns 16 through the via holes 19 for allowance of the connection to external element.

Figure 7D:
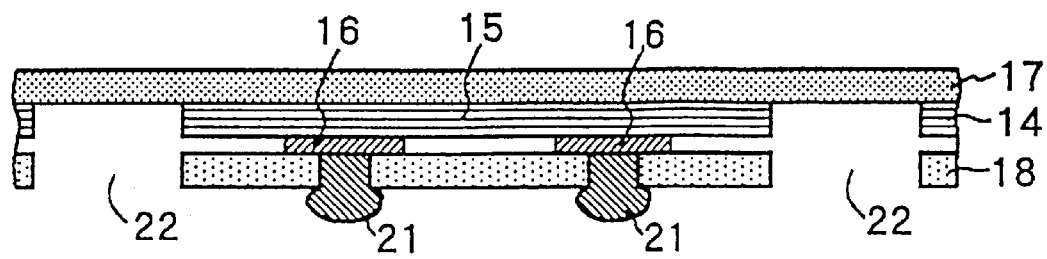

As illustrated in FIG. 7D, by use of the dicing recognition pattern 20, the semiconductor wafer 14 and the insulating substrate 18 are cut or diced to ensure the size of the semiconductor device 15 whereby the cured resin 17 is shown through dicing regions 22. In the dicing process, the dicing recognition patterns 20 can directly be recognized whereby the dicing positions can accurately be decided. No problem is raised with misrecognition in the operation of the automatic recognizing dicing system. The dicing width may be 150 micrometers.

As a modification, it is possible that the dicing recognition pattern 20 may be formed in the insulating substrate 18. In this case, the dicing recognition pattern 20 remains after the dicing process.

Figure 7E:
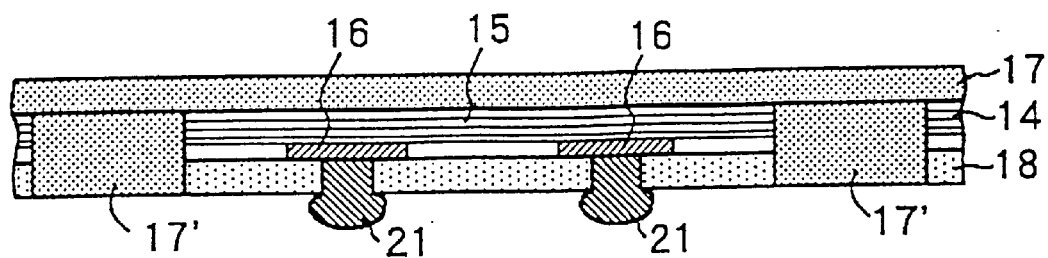

As illustrated in FIG. 7E, a resin 17' is flowed into the diced region 22 and also onto the cured resin layer 17 as well as onto the sides of the semiconductor devices 15 and the insulation substrate 18 before the resin 17' is cured. In this process, the resin 17' securely contacts with cured resin layer 17. However, the resin 17' having flowed does not reach the sides of the electrode patterns 16 because of a small gap between the semiconductor wafer 14 and the insulating substrate 18. The dicing width may be 30 micrometers.

Figure 7F:
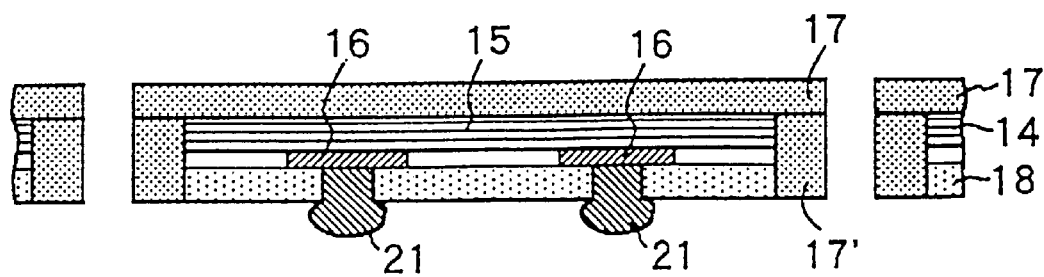

As illustrated in FIG. 7F, the cured resins 17 and 17' are concurrently cut to divide the semiconductor devices into individuals whereby the chip semiconductor devices having near size as the semiconductor devices are formed.

The dicing width of FIG. 7F is narrower than the dicing width of FIG. 7D so that the resin 17' remains on the sides of the diced semiconductor devices 15 and the insulating substrate 18.

The alignment of the electrode pattern 16 to form the via holes 19 is made by use of the alignment recognition pattern wherein an infrared ray transmission microscope is used to read out the recognition pattern. In this case, it might be possible that opening positions of the photo-resist 13 for forming the via holes 19 are displaced in a direction of arrow mark "X" from the position of the electrode pattern 16 due to refractive index of the insulation substrate 18 and others.

By checking the patterns of the photo-resist 13, any displacement can be detected. In this case, this photo-resist pattern is removed for a fresh photo-resist pattern should be provided for allowance of the accurate alignment to the electrode patterns to form the via holes 19.

Figure 8:
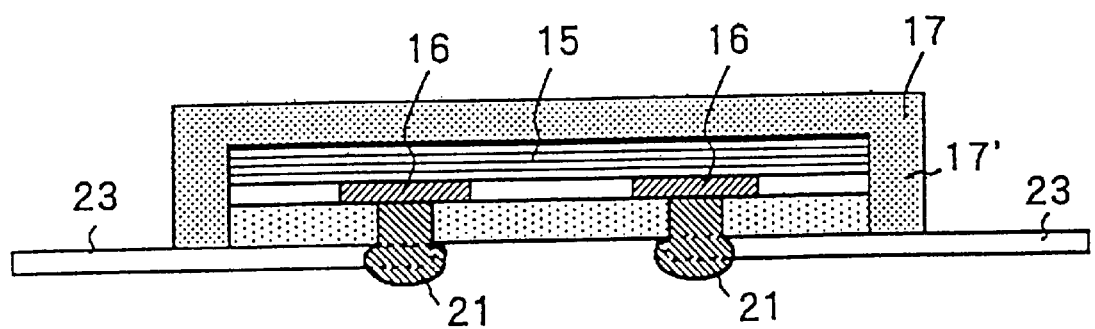
FIG. 8 is a fragmentary cross sectional elevation view illustrative of still another novel method of forming a plurality of semiconductor devices from a semiconductor wafer in accordance with the present invention.

In addition, as illustrated in FIG. 8, lead electrodes 23 may be connected to the metal bumps 21.

There is no process for mounting the individual semiconductor elements separately because the electrode patterns of the insulating substrate is bonded to the bumps on the semiconductor elements on the wafer.

There is raised no problem with deterioration in the accuracy of the alignment of the semiconductor devices.

It is further possible to form a sealing resin film with a uniform and reduced thickness.

further more, the shape and the size of the insulating substrate are the same as the semiconductor wafer because the electrode pattern of the insulating substrate is bonded to the bumps of the semiconductor elements.

It is easily possible to position the bumps and the semiconductor elements because the size and shape of the insulating substrate are the same as the semiconductor wafer as well as because the electrode patterns are so formed by use of positional coordinates of the electrodes over the semiconductor wafer.

Whereas modifications of the present invention will be apparent to a person having ordinary skill in the art, to which the invention pertains, it is to be understood that embodiments as shown and described by way of illustrations are by no means intended to be considered in a limiting sense. Accordingly, it is to be intended to cover by claims all modifications which fall within the spirit and scope of the present invention.

What is claimed is:

1. A method of fabricating a chip semiconductor device comprises the steps of:

providing electrically conductive bumps on electrodes of semiconductor elements on a wafer;

combining an insulating substrate having an electrode pattern onto the wafer so that the electrode pattern contacts the bumps;

dividing only the wafer on which the semiconductor elements are provided with grooves into a plurality of chips each of which has a semiconductor element;

flowing a liquid resin into the grooves and onto the chips for subsequent curing the resin; and concurrently dicing the cured resin and the insulating substrate along the grooves so that a plurality of semiconductor devices are formed.

2. The method as claimed in claim 1, wherein the shape and the size of the insulating substrate are the same as the semiconductor wafer.

3. The method as claimed in claim 1, wherein positions of the electrode patterns are decided on the basis of positional coordinate data of the electrode over the semiconductor wafer.

4. The method as claimed in claim 3, wherein only the semiconductor wafer is diced.

5. The method as claimed in claim 1, wherein a dicing width in the third step is wider than a dicing width of the fifth step.

6. A method of fabricating a chip semiconductor device comprises the steps of:

applying a first resin on a first surface of a semiconductor wafer having a second surface on which a plurality of semiconductor elements have already been provided, which have a predetermined electrode pattern, before the applied resin is cured;

combining an insulating substrate onto the second surface of the semiconductor wafer;

forming via holes and dicing recognition patterns in the insulating substrate so that the electrode pattern is partially shown through the via holes;

forming electrically conductive bumps, which are connected through the via holes to the electrode pattern;

using the dicing recognition pattern to form grooves in the combined semiconductor wafer and the insulating substrate so as to divide the combined semiconductor wafer and the insulating substrate into a plurality of parts by the grooves;

filling a second resin into the grooves and then curing the resin; and cutting off the combined semiconductor wafer and the insulating substrate along the grooves filled with the second resin so that the combined semiconductor wafer and the insulating substrate are divided into a plurality of semiconductor devices.

7. The method as claimed in claim 6, wherein the insulation substrate has no electrode pattern.

8. The method as claimed in claim 6, wherein the divided semiconductor devices have cross sections which are covered by and protected by the second resin.

9. The method as claimed in claim 6, wherein the first and second resins prior to the curing process are the same resin material in a liquid state.

10. The method as claimed in claim 6, further comprising a step of providing an additional process for connecting lead electrodes onto the electrically conductive bumps.

11. The method as claimed in claim 6, wherein the electrically conductive bumps are made of a metal.

12. The method of claim 1, further comprising the step of providing each of the wafer and the insulating substrate with identical orientation flats, and wherein the step of combining the insulating substrate and the wafer comprises the step of aligning the orientation flats.

* * * * *